United States Patent [19]
Hsu et al.

[11] Patent Number: 5,693,974
[45] Date of Patent: Dec. 2, 1997

[54] ELEVATED SOURCE/DRAIN WITH SOLID PHASE DIFFUSED SOURCE/DRAIN EXTENSION FOR DEEP SUB-MICRON MOSFETS

[75] Inventors: Ching-Hsiang Hsu; Mong-Song Liang, both of Hsin-chu, Taiwan

[73] Assignee: Taiwan Semiconductor Manufacturing Company Ltd, Hsin-chu, Taiwan

[21] Appl. No.: 606,159

[22] Filed: Feb. 23, 1996

Related U.S. Application Data

[62] Division of Ser. No. 498,676, Jul. 3, 1995, Pat. No. 5,504, 031.

[51] Int. Cl.⁶ .......................... H01L 29/76; H01L 29/94; H01L 27/088
[52] U.S. Cl. .............. 257/369; 257/377; 257/900
[58] Field of Search ............................. 257/369, 370, 257/371, 377, 382, 900

[56] References Cited

U.S. PATENT DOCUMENTS

| | | | |
|---|---|---|---|
| 5,182,225 | 1/1993 | Matthews | 257/371 |
| 5,242,847 | 9/1993 | Ozturk et al. | 437/41 |
| 5,340,754 | 8/1994 | Witek et al. | 437/32 |

*Primary Examiner*—Wael Fahmy
*Attorney, Agent, or Firm*—George O. Saile; Rosemary L. S. Pike

[57] ABSTRACT

A semiconductor substrate is provided having n-channel and p-channel active areas separated by isolation areas. Gate electrodes are formed overlying a gate oxide layer over each of the active areas. First spacers are formed on the sidewalls of the gate electrodes wherein the first spacers have a first dopant concentration. The first spacers in the p-channel active area are removed and second spacers are formed on the sidewalls of the gate electrodes in the p-channel active area wherein the second spacers have a second dopant concentration different from the first dopant concentration. An epitaxial layer is grown on the surface of the semiconductor substrate wherein the epitaxial layer forms the elevated source/drain structure. First ions are implanted into the n-channel active area and second ions are implanted into the p-channel active area. The first and second ions are driven in to form heavily doped regions within the semiconductor substrate underlying the elevated source/drain structure. The driving in also drives in the first and second dopant concentrations of the first and second spacers to form source/drain extensions within the n-channel and p-channel active areas underlying the first and second spacers to complete the formation of the elevated source/drain structure with solid-phase diffused source/drain extensions in the manufacture of an integrated circuit.

10 Claims, 6 Drawing Sheets

ELEVATED SOURCE/DRAIN WITH SOLID PHASE DIFFUSED SOURCE/DRAIN EXTENSION FOR DEEP SUB-MICRON MOSFETS

This application is a division of Ser. No. 08/498,676 filed Jul. 3, 1995 now U.S. Pat. No. 5,504,031.

RELATED PATENT APPLICATION

U.S. Patent Application TSMC94-064 filed by the same inventors, C. H. Hsu and M. S. Liang.

BACKGROUND OF THE INVENTION

(1) Field of the Invention

The invention relates to the fabrication of integrated circuit devices, and more particularly, to a method of forming an elevated source/drain with solid phase diffused source/drain extensions for improved performance of deep submicron MOSFETS in the fabrication of integrated circuits.

(2) Description of the Prior Art

As integrated circuit devices become smaller, especially in the deep submicron regime, performance concerns become more pressing. In particular, a shallow junction is desired in deep submicron integrated circuit devices because shallow junctions provide a smaller short channel effect and larger punch through voltage. It is difficult to implement a shallow junction with source/drain ion implantation. Usually, a deep junction results from ion implantation. FIG. 1 illustrates a partially completed integrated circuit having a gate electrode 18 formed over a gate oxide layer 16 on a semiconductor substrate 10. Ion implantation 51 forms deep junctions 53. Shallow junctions 55 are formed lightly doped drain (LDD) ion implant before sidewall spacer 19 formation. However, even with the LDD ion implant, ultra shallow junction depth cannot be achieved.

FIG. 2 illustrates another prior art process. In this process, shallow junctions 57 are formed by solid phase diffusion of impurities from a deposited phosphosilicate glass (PSG) or borosilicate glass (BSG) into the semiconductor substrate. However, since the entire region of the source and drain is very shallow, the metallurgy to contact the source or drain will penetrate through the source or drain resulting in a junction short.

Using an elevated source/drain structure, the junction can be formed above the silicon surface. This allows the junction depth to be ultra shallow. In addition, due to the elevated source/drain, the source/drain has enough thickness to support the consumption of metallization.

FIG. 3 illustrates a process in which elevated source/drain regions 59 are formed. The problem with this approach is that the source/drain regions 59 may not connect with the channel region 63 because of the presence of the sidewall spacers 19. Also, if the drive-in step is too long, the junction 61 will be too deep for the source/drain to channel connection. If the junctions 65, illustrated in FIG. 4, are formed by lightly doped source and drain ion implantation before the formation of the elevated source/drain regions, the thermal budget of the selective epitaxial growth used to form the elevated source/drain will drive-in the source/drain dopant too deeply into the substrate.

In order to resolve the problems stated above, disposable spacer technology has been tried. U.S. Pat. No. 5,296,727 to Kawai et al and the article, "Reverse Elevated Source/Drain (RESD) MOSFET for Deep Submicron CMOS," by J. R. Pfiester et al, IEDM 1992, pp. 885–888, teach methods of forming reverse and elevated source/drain regions. As illustrated in FIG. 5, after formation of the elevated source/drain 59, the gate electrode sidewall spacers are removed. Ions 67 are implanted through the openings to the substrate to form lightly doped source and drain regions 69. However, this process could be quite complicated.

It is desirable to provide a simple process of source/drain formation that can achieve high performance especially in deep submicron MOSFET integrated circuits.

SUMMARY OF THE INVENTION

A principal object of the present invention is to provide an effective and very manufacturable method of forming source/drain regions to achieve high performance in the fabrication of an integrated circuit.

Another object of the present invention is to provide a method of forming an elevated source/drain structure in the fabrication of an integrated circuit.

Yet another object of the present invention is to provide a method of forming an elevated source/drain structure with a solid phase diffused source/drain extension in an integrated circuit.

A further object of the invention is to provide a method of forming an elevated source/drain structure with a solid phase diffused source/drain extension in deep submicron devices.

In accordance with the objects of this invention the method of forming an elevated source/drain structure with a solid phase diffused source/drain extension is achieved. A semiconductor substrate is provided having active areas separated by isolation areas wherein there is an n-channel active area and a p-channel active area. A gate oxide layer is provided over the surface of the semiconductor substrate. A layer of polysilicon is deposited overlying the gate oxide layer and patterned to form gate electrodes over each of the active areas. The polysilicon layer remaining is oxidized to form a silicon oxide layer over all surfaces of the gate electrodes. First spacers are formed on the sidewalls of the gate electrodes wherein the first spacers have a first dopant concentration. A mask is formed over the n-channel active area. The first spacers in the p-channel active area are removed and second spacers are formed on the sidewalls of the gate electrodes in the p-channel active area wherein the second spacers have a second dopant concentration different from the first dopant concentration. The mask is removed. An epitaxial layer is grown on the surface of the semiconductor substrate wherein the epitaxial layer forms the elevated source/drain structure. A mask is formed over the p-channel active area. First ions are implanted into the n-channel active area and the mask is removed. A mask is formed over the n-channel active area. Second ions are implanted into the p-channel active area and the mask is removed. The first and second ions are driven in to form heavily doped regions within the semiconductor substrate underlying the elevated source/drain structure. The driving in also drives in the first and second dopant concentrations of the first and second spacers to form source/drain extensions within the n-channel and p-channel active areas underlying the first and second spacers to complete the formation of the elevated source/drain structure with solid-phase diffused source/drain extensions in the manufacture of an integrated circuit.

Also, in accordance with the objects of this invention, an integrated circuit device having an elevated source/drain structure with a solid phase diffused source/drain extension is described. The integrated circuit device comprises a semiconductor substrate having active areas separated by isolation areas wherein there is an n-channel active area and a p-channel active area. A gate oxide layer overlies the surface of the semiconductor substrate. Gate electrodes overlie each of the active areas. First spacers on the sidewalls of the gate electrodes overlying the n-channel active area spacers have a first dopant concentration. Second spacers on the sidewalls of the gate electrodes overlying the p-channel active area have a second dopant concentration different from the first dopant concentration. An elevated source/drain structure overlies the surface of the semiconductor substrate. Heavily doped regions forming shallow junctions within the semiconductor substrate underlie the elevated source/drain structure. Solid-phase diffused source/drain extensions forming ultra shallow junctions within the n-channel and p-channel active areas underlie the first and second spacers.

BRIEF DESCRIPTION OF THE DRAWINGS

In the accompanying drawings forming a material part of this description, there is shown.

DESCRIPTION OF THE PREFERRED EMBODIMENTS

Referring now more particularly to FIGS. 6 through 11 there is shown an embodiment of the method for fabricating an elevated source/drain structure with a solid phase diffused source/drain extension. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

Figure 1:
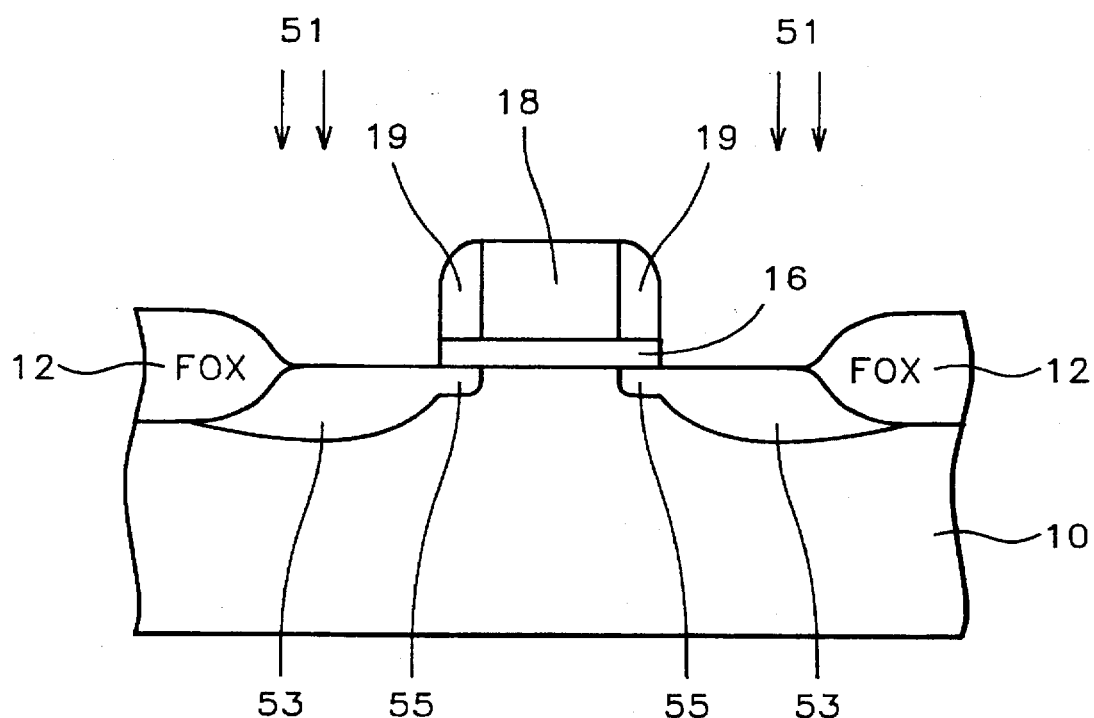
FIGS. 1 through 5 schematically illustrate in cross-sectional representation various source/drain implementations of the prior art.
Figure 2:
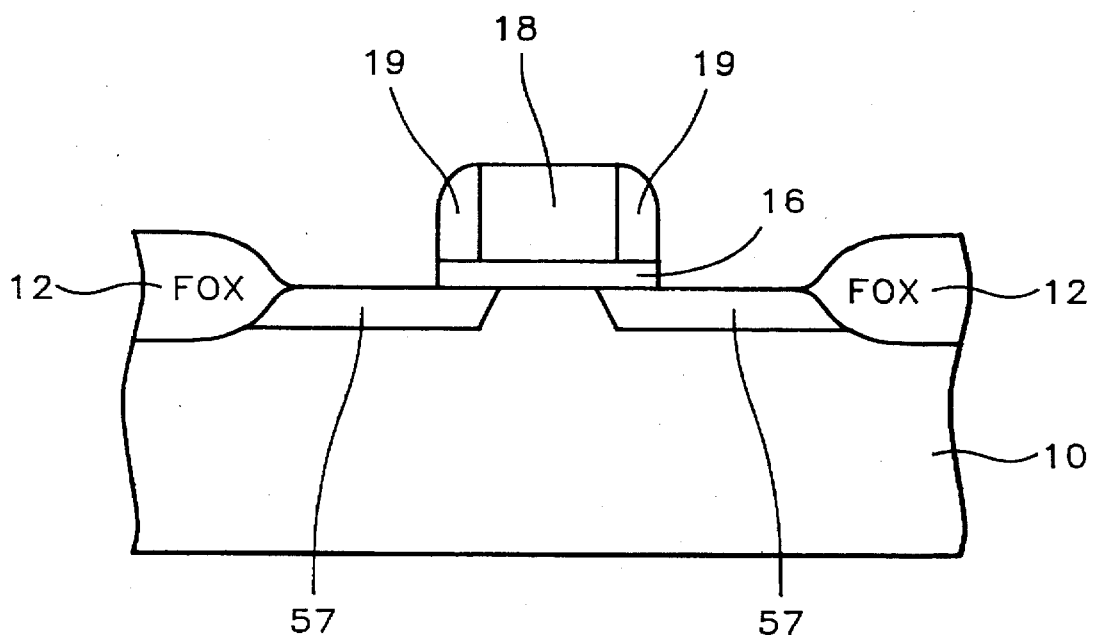
Figure 3:
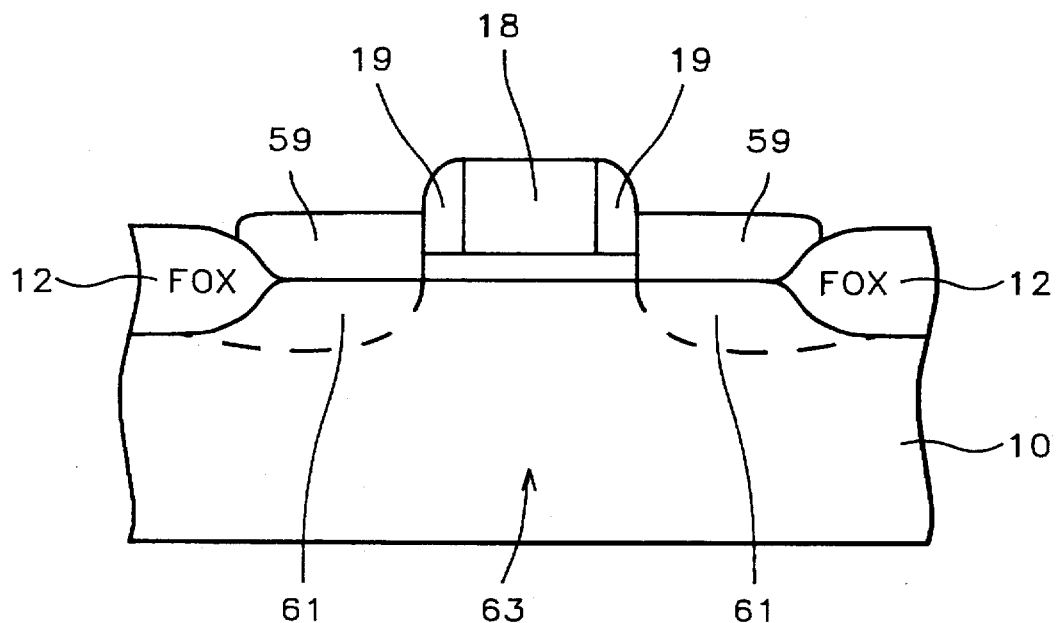
Figure 4:
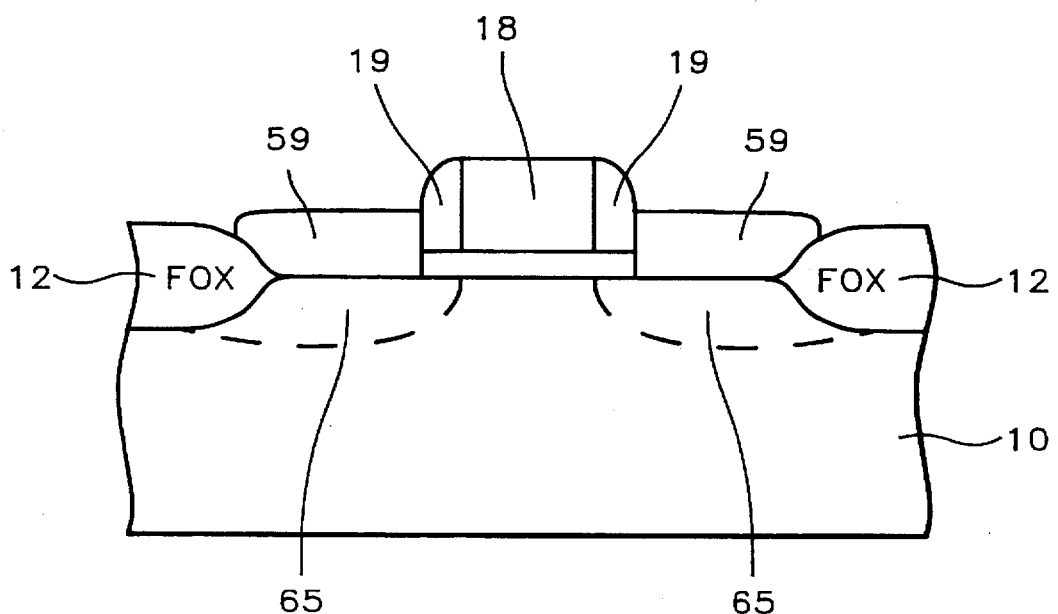
Figure 5:
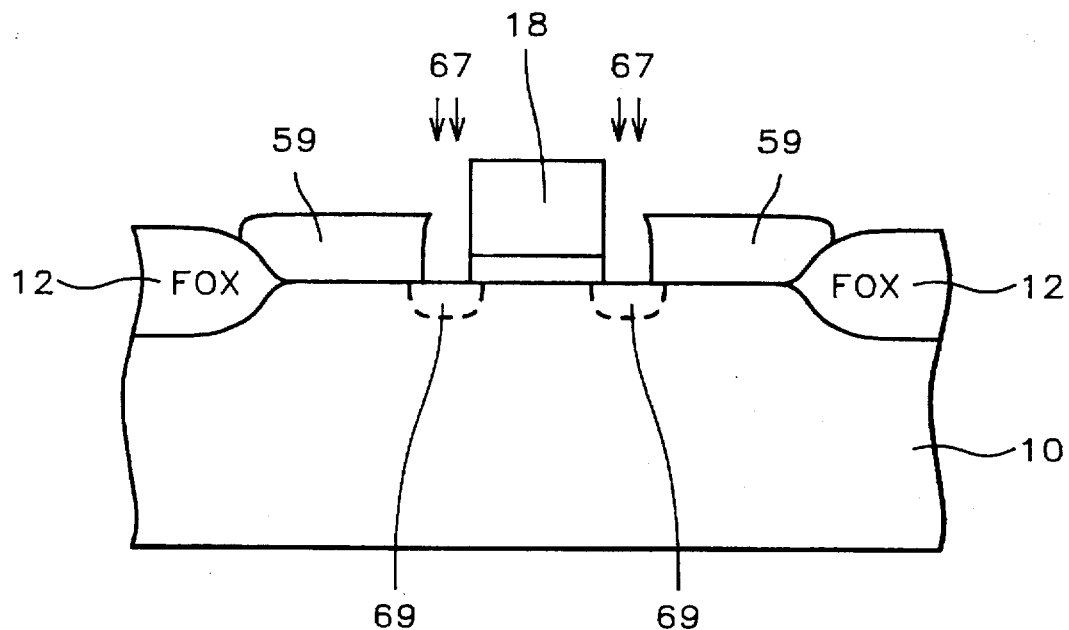
Figure 6:
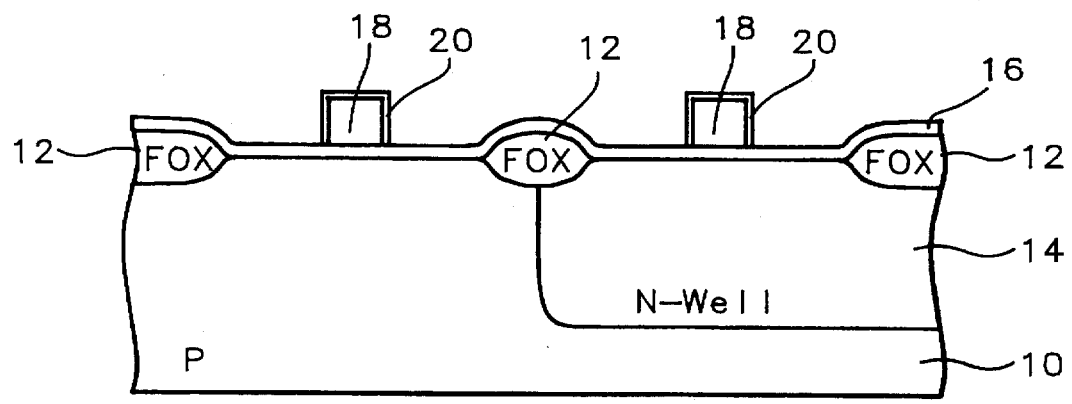
FIGS. 6 through 11 schematically illustrate in cross-sectional representation a preferred embodiment of the present invention.

As illustrated, the semiconductor substrate 10 is a P-substrate. Ions are implanted into the p-channel active area B to form the N-well region 14, as shown in FIG. 6. The N-well is formed by implanting phosphorus ions at a dosage of between about 1 E 11 to 1 E 12 atoms/cm$^2$ and an energy of between about 100 to 150 KeV. It is well understood that the semiconductor substrate could be an N-substrate and a P-well could be formed in the n-channel region A. Likewise, both N- and P-wells could be formed. A P-well, not shown would be formed by implanting boron ions at a dosage of between about 1 E 11 to 1 E 12 atoms/cm$^2$ and an energy of between about 100 to 150 KeV.

The surface of the silicon substrate 10 is thermally oxidized to form the desired gate oxide 16 thickness. The preferred thickness is between about 50 to 100 Angstroms. A polysilicon layer is blanket deposited to a thickness of between about 1500 to 2000 Angstroms and patterned to provide gate electrodes 18 on the surface of the n-channel and p-channel active areas, A and B, respectively. The polysilicon is reoxidized to provide a silicon oxide layer 20 on the surfaces of the polysilicon gate electrodes 18.

Figure 7:
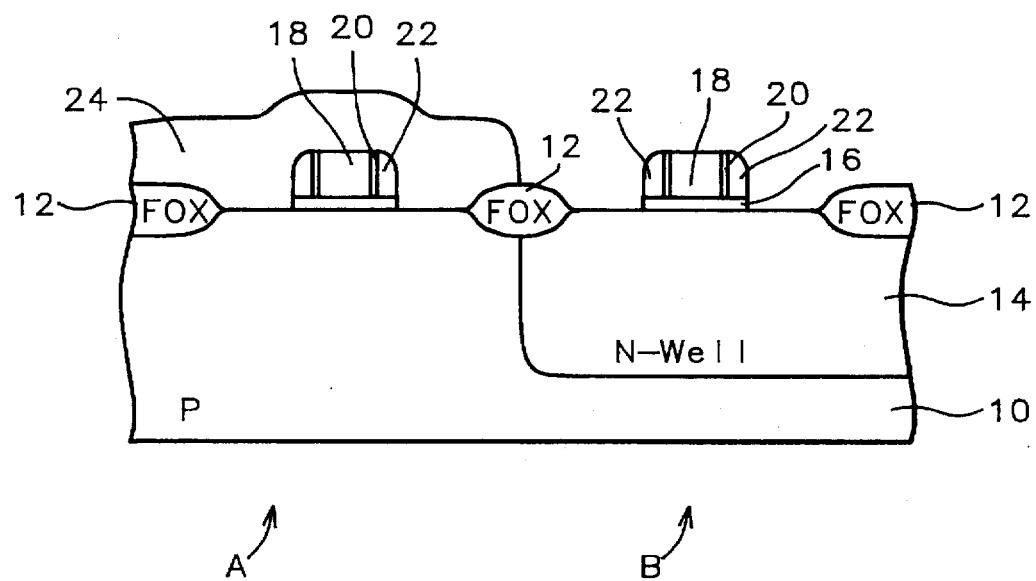

Referring now to FIG. 7, an insulating layer of phosphosilicate glass (PSG) is deposited over the surface of the patterned polysilicon gate electrodes. The insulating layer is anisotropically etched leaving the insulating layer on the sidewalls of the polysilicon. The PSG sidewalls 22 are shown in FIG. 7. The anisotropic etch also etches away the oxide layer 20 on the top surface of the polysilicon lines and etches away the gate silicon oxide not covered by the gate electrodes and the PSG sidewalls.

Figure 8:
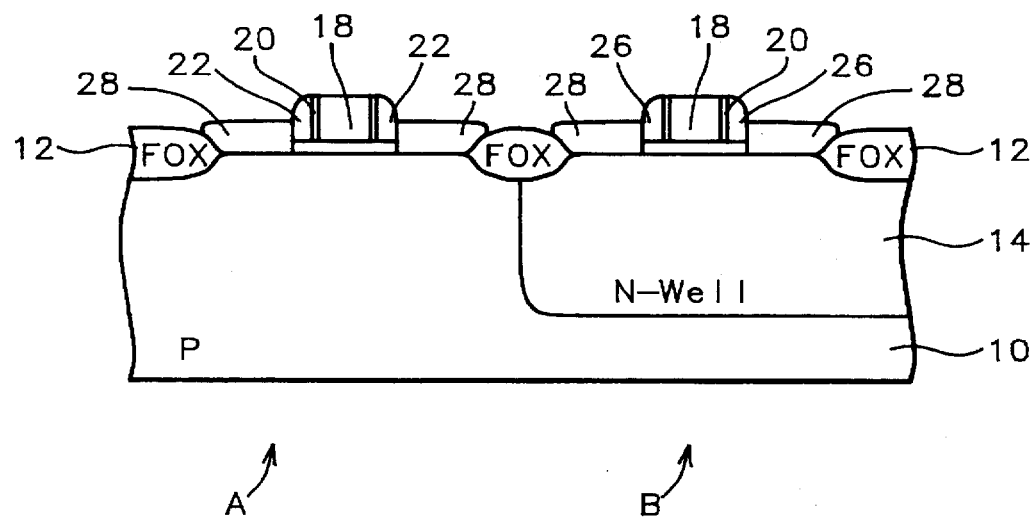

The n-channel region A is protected with a coating of photoresist 24. The PSG sidewalls 22 in the unprotected p-channel region B are etched away using, for example wet etching in dilute HF solutions. A layer of borosilicate glass (BSG) is deposited over the surface of the substrate and anisotropically etched away to leave sidewalls 26 on the gate electrode 18 in the p-channel region B as illustrated in FIG. 8. The photoresist coating 14 is removed.

A selective epitaxial layer 28 is grown on the exposed silicon surface on either side of the gate electrodes 18 within the active regions to a thickness of between about 900 to 1100 Angstroms.

Figure 9:
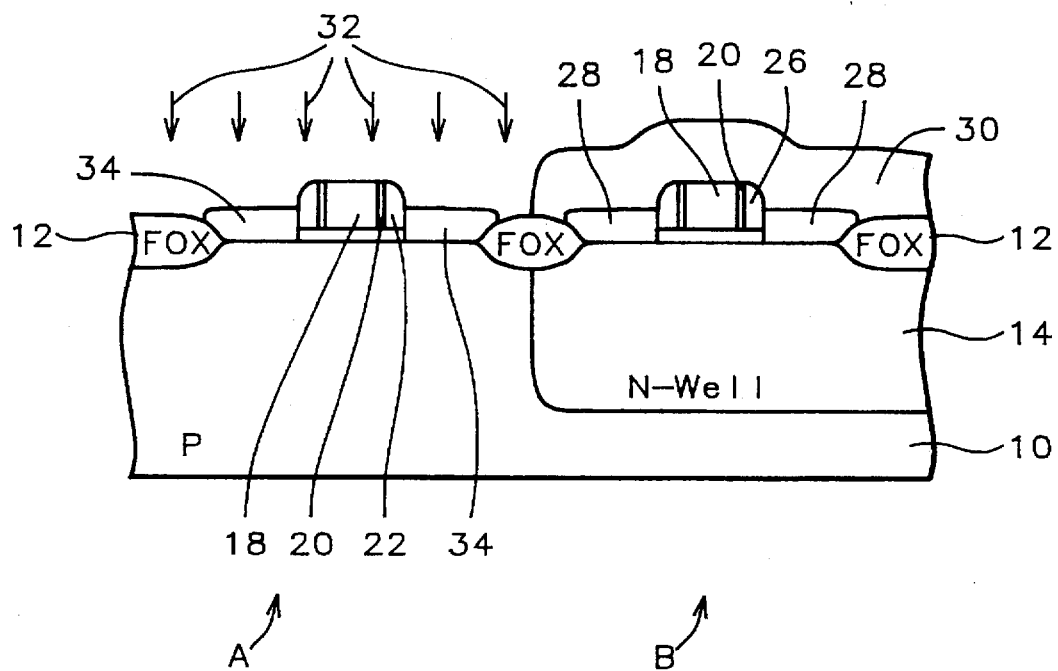

Referring now to FIG. 9, a layer of photoresist is coated over the surface of the substrate and patterned to provide a mask 30 to protect the p-channel area B. Arsenic ions 32 are implanted into the selective epitaxial areas 28, as shown in FIG. 8, not protected by the photoresist mask 30 to form n-channel elevated source and drain regions 34. The ions 32 are implanted at an energy of between about 40 to 60 KeV and a dosage of between about 3 E 15 to 5 E 15 atoms/cm$^2$.

Figure 10:
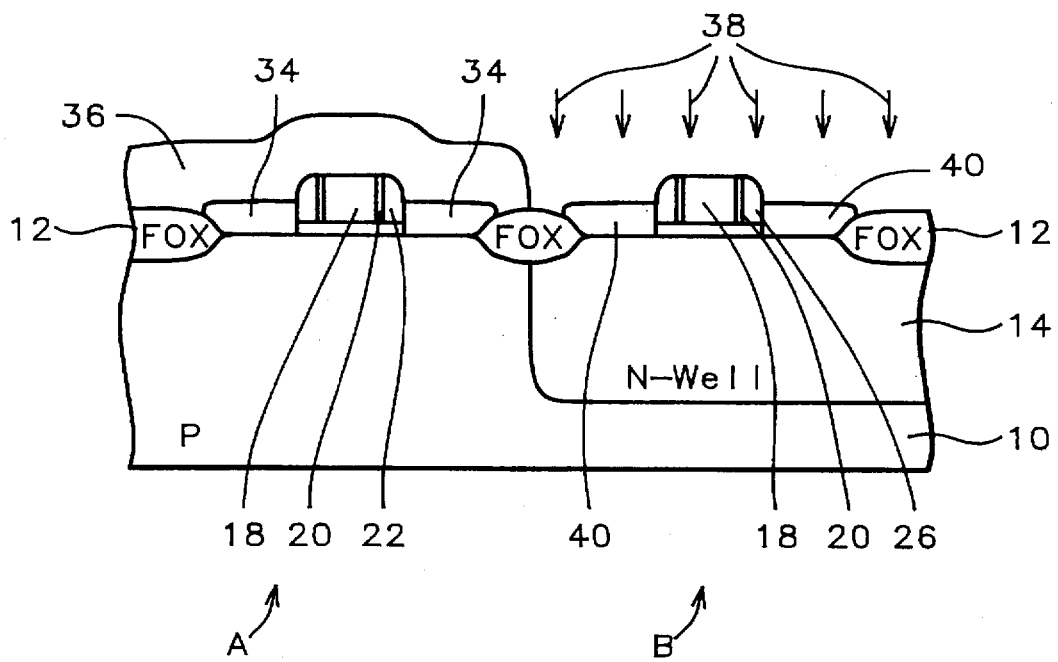

Referring now to FIG. 10, a photoresist mask 36 is formed to protect the n-channel region A. Boron or BF$_2$ ions 38 are implanted into the selective epitaxial areas 28, as shown in FIG. 9, not protected by the photoresist mask 36 to form p-channel elevated source and drain regions 40. The ions 38 are implanted at an energy of between about 25 to 40 KeV and a dosage of between about 3 E 15 to 5 E 15 atoms/cm$^2$.

Figure 11:
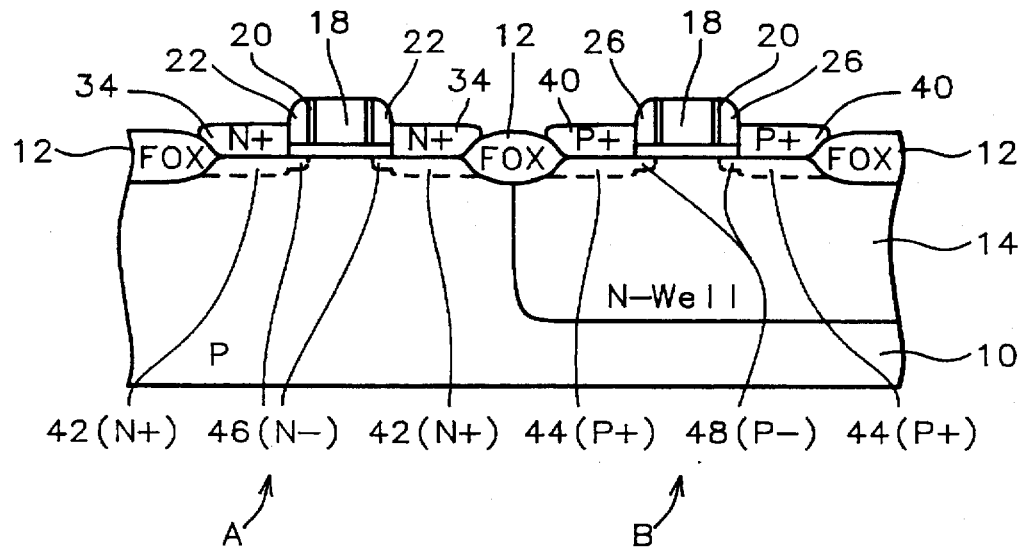

The semiconductor substrate is annealed at a temperature of between about 850° to 900° C. for a duration of between about 20 to 30 minutes to drive-in the impurities from the elevated source/drains to form shallow (junction depth for N+ and P+ about equal to or less than 1000 Å) N+ junctions 42 and P+ junctions 44, as shown in FIG. 11. This annealing step also forms the lightly doped ultra shallow (junction depth for N– and P– about equal to or less than 500 Å) junctions 46 and 48. The impurities from the PSG sidewalls 22 penetrate the substrate underlying the sidewalls to form ultra shallow N-junctions 46. The impurities from the BSG sidewalls 26 penetrate the substrate underlying the sidewalls to form ultra shallow P-junctions 48. Depending upon the concentration of PSG and BSG, the concentrations of the ultra shallow junctions 46 and 48 can be between about 1 E 18 to 5 E 19 atoms/cm$^3$.

The process of the present invention provides a number of advantages over the prior art processes. The source/drain extension can be formed during the selective epitaxial growth process or during drive-in. The source/drain extension may be lightly or heavily doped depending upon the sidewall spacer concentration. A preferred sidewall concentration for ultra shallow junctions is about 4% phosphorus or 4% boron in the PSG and BSG, respectively. The process of the present invention provides ultra shallow junctions. Because of the elevated source/drain, the source/drain has enough thickness to support the consumption of metallization. Additionally, the process is a simple one in which the ultra shallow junctions are formed by solid phase diffusion during formation of the elevated source/drain.

Figure 12:
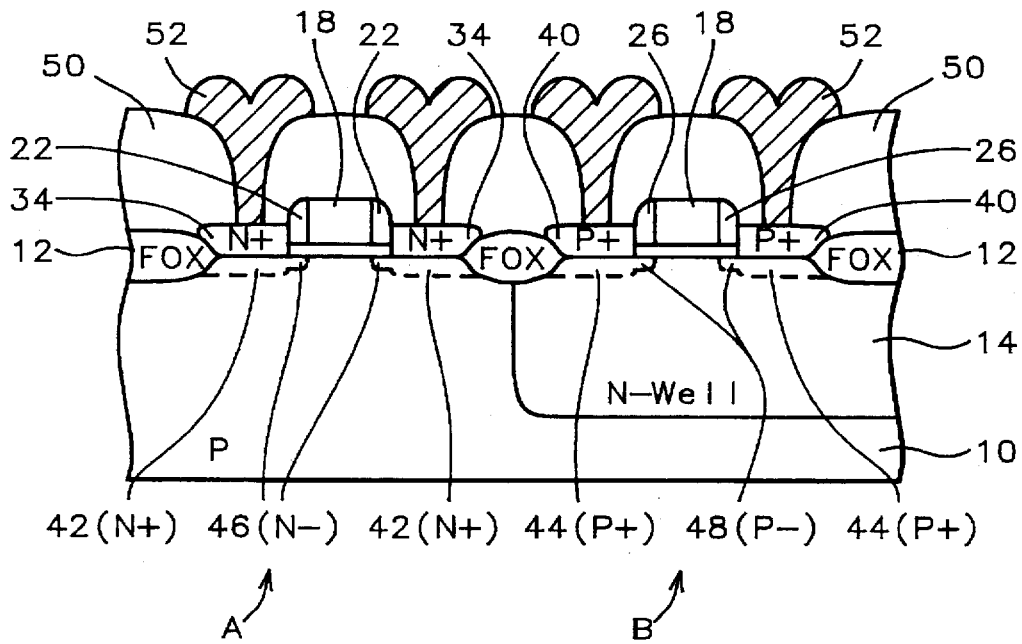
FIG. 12 schematically illustrates in cross-sectional representation a completed integrated circuit of the present invention.

Processing continues as is conventional in the art to form dielectric layer 50 and to make contact to the source and drain regions with subsequent metallurgy 52, as illustrated in FIG. 12. As is well understood by those skilled in the art, the electrical connections will be completed by subsequent conducting layers, not shown.

The integrated circuit device of the present invention having an elevated source/drain structure with a solid phase diffused source/drain extension will be described with reference to FIG. 12. The integrated circuit device comprises a semiconductor substrate 10 having active areas separated by isolation areas wherein there is an n-channel active area A and a p-channel active area B. A gate oxide layer 16 overlies the surface of the semiconductor substrate. Gate electrodes 18 overlie each of the active areas. First spacers 22 on the sidewalls of the gate electrodes overlying the n-channel active area spacers have a first dopant concentration. Second spacers 26 on the sidewalls of the gate electrodes overlying the p-channel active area have a second dopant concentration different from the first dopant concentration. An elevated source/drain structure 34 and 40 in the n-channel and p-channel active areas, respectively, overlies the surface of the semiconductor substrate. Heavily doped regions 42 and 44 forming shallow junctions within the semiconductor substrate underlie the elevated source/drain structure. Solid-phase diffused source/drain extensions 46 and 48 forming ultra shallow junctions within the n-channel and p-channel active areas underlie the first and second spacers. The device of the present invention has shallow junctions under the elevated source/drain regions and ultra shallow junctions as the source/drain extensions. These junctions are shallow enough to provide high performance in deep submicron devices because of the reduced short channel effect and larger punch through voltage.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:

a semiconductor substrate having a surface and active areas separated by isolation areas wherein there is an n-channel active area and a p-channel active area;

gate electrodes overlying each of said active areas;

first spacers on the sidewalls of said gate electrodes overlying said n-channel active area wherein said first spacers have a first dopant concentration;

second spacers on the sidewalls of said gate electrodes overlying said p-channel active area wherein said second spacers have a second dopant concentration opposite from said first dopant concentration;

an elevated source/drain structure overlying the surface of said semiconductor substrate adjacent each of said gate electrodes;

heavily doped regions forming shallow junctions having a junction depth of equal to or less than 1000 Angstroms within said semiconductor substrate underlying said elevated source/drain structure; and solid-phase diffused source/drain extensions forming ultra shallow junctions having a junction depth of equal to or less than 500 Angstroms within said n-channel and p-channel active areas underlying said first and second spacers.

2. A device according to claim 1 wherein said first spacers comprise phosphosilicate glass.

3. A device according to claim 1 wherein said second spacers comprise borosilicate glass.

4. A device according to claim 1 wherein said elevated source/drain structure has a thickness of between about 900 to 1100 Angstroms.

5. A device according to claim 1 wherein said solid-phase diffused source/drain extensions have a concentration of between about 1 E 18 to 5 E 19 atoms/cm$^3$.

6. An integrated circuit device comprising:

a semiconductor substrate having a surface and active areas separated by isolation areas wherein there is an n-channel active area and a p-channel active area;

gate electrodes overlying each of said active areas;

first spacers on the sidewalls of said gate electrodes overlying said n-channel active area wherein said first spacers have a first dopant concentration;

second spacers on the sidewalls of said gate electrodes overlying said p-channel active area wherein said second spacers have a second dopant concentration opposite from said first dopant concentration;

an elevated source/drain structure overlying the surface of said semiconductor substrate adjacent each of said gate electrodes;

heavily doped regions forming shallow junctions having a junction depth of equal to or less than 1000 Angstroms within said semiconductor substrate underlying said elevated source/drain structure;

solid-phase diffused source/drain extensions forming ultra shallow junctions having a junction depth of equal to or less than 500 Angstroms within said n-channel and p-channel active areas underlying said first and second spacers;

a dielectric layer overlying said gate electrodes and said elevated source/drain structure; and a patterned conducting layer extending downward through said dielectric layer and contacting said elevated source/drain structure.

7. A device according to claim 6 wherein said first spacers comprise phosphosilicate glass.

8. A device according to claim 6 wherein said second spacers comprise borosilicate glass.

9. A device according to claim 6 wherein said elevated source/drain structure has a thickness of between about 900 to 1100 Angstroms.

10. A device according to claim 6 wherein said solid-phase diffused source/drain extensions have a concentration of between about 1 E 18 to 5 E 19 atoms/cm$^3$.

* * * * *